Figure 1:
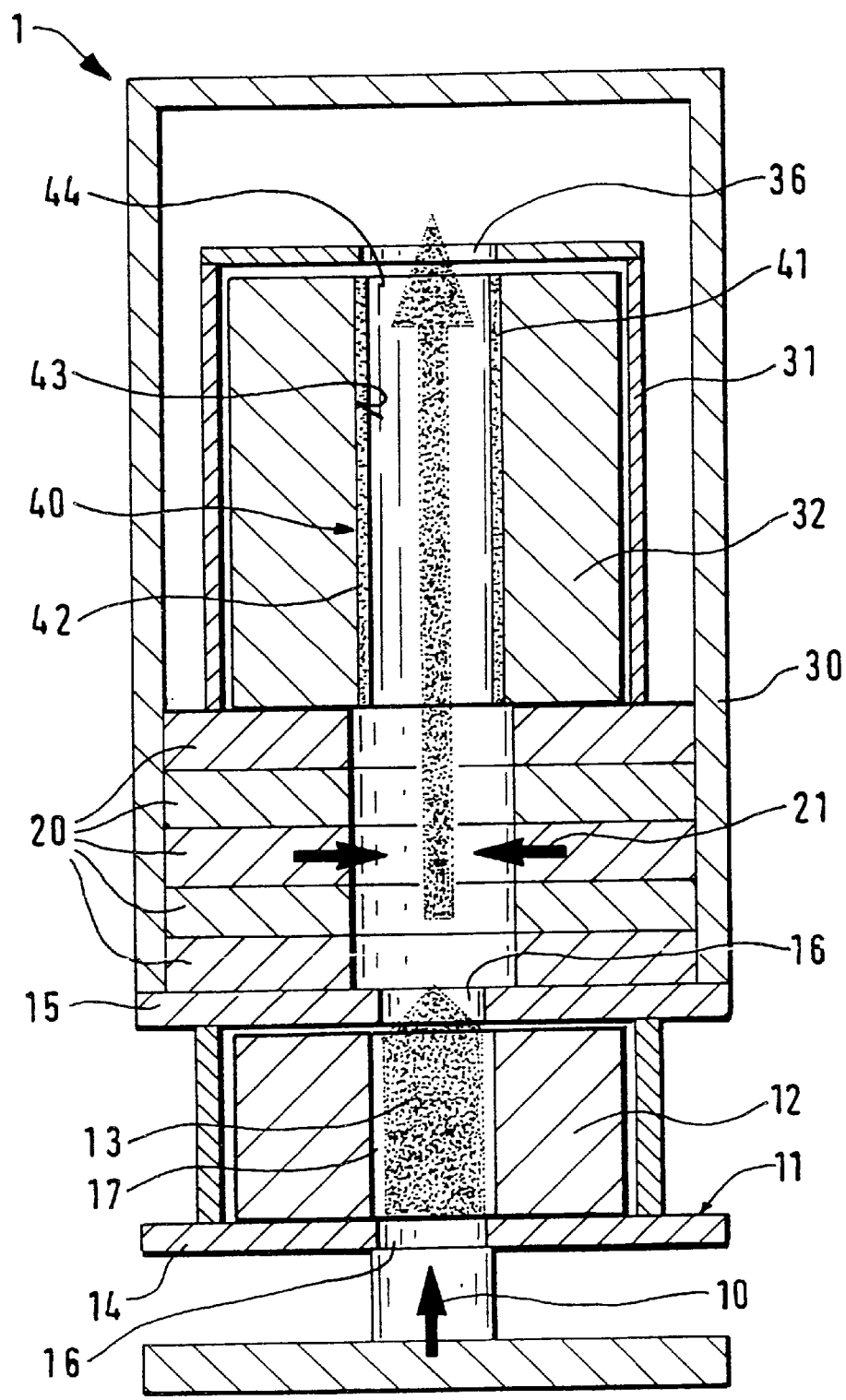

United States Patent
Jung et al.

[11] Patent Number: 6,129,856
[45] Date of Patent: Oct. 10, 2000

[54] PROCESS FOR SURFACE-FINISHING INNER SURFACES OF HOLLOW BODIES AND APPARATUS FOR CARRYING OUT THE PROCESS

[75] Inventors: Thomas Jung, Hotzum; Anke Hellmich, Aschafturburg, both of Germany

[73] Assignee: Fraunhofer-Gesellschaft zur Forderung der angewandten Forschung e.V., Munich, Germany

[21] Appl. No.: 09/103,288

[22] Filed: Jun. 23, 1998

[30] Foreign Application Priority Data

Jun. 23, 1997 [DE] Germany .............. 197 26 443

[51] Int. Cl.[7] .................. C03C 15/00
[52] U.S. Cl. .................. 216/63; 156/637.1; 118/723 ER
[58] Field of Search .............. 118/623, 723 ER; 216/63; 156/637.1; 427/237, 238, 249

[56] References Cited

U.S. PATENT DOCUMENTS

| | | |
|---|---|---|
| 3,746,569 | 7/1973 | Pammer et al. . |
| 4,294,871 | 10/1981 | Hieber et al. . |
| 4,450,787 | 5/1984 | Weakliem et al. . |
| 4,713,259 | 12/1987 | Gartner et al. . |
| 5,800,880 | 9/1998 | Laurent . |
| 5,972,436 | 10/1999 | Walther . |

FOREIGN PATENT DOCUMENTS

| | | |
|---|---|---|
| 28 20 301 | 11/1979 | Germany . |
| 294 511 A5 | 10/1983 | Germany . |
| 42 35 953 A1 | 4/1994 | Germany . |
| 44 22 472 C2 | 1/1996 | Germany . |
| 42 10 125 C2 | 2/1996 | Germany . |
| 63-137165 | 11/1986 | Japan . |
| 62-167882 | 7/1987 | Japan . |
| 63-26373 | 2/1988 | Japan . |
| 63-137167 | 6/1988 | Japan . |

*Primary Examiner*—Frankie L. Stinson
*Attorney, Agent, or Firm*—Salter & Michaelson

[57] ABSTRACT

In a process for surface-finishing inner surfaces of hollow bodies with at least one opening the hollow body is finished from inside by means of a hollow-cathode glow discharge as the excitation source.

7 Claims, 2 Drawing Sheets

PROCESS FOR SURFACE-FINISHING INNER SURFACES OF HOLLOW BODIES AND APPARATUS FOR CARRYING OUT THE PROCESS

The invention relates to a process for surface-finishing inner surfaces of hollow bodies with at least one opening and to an apparatus for carrying out the process.

Processes for finishing inner surfaces of hollow bodies are known. In such cases, for example, a coating is provided by means of a thermal chemical gas phase deposition process, the chemical vapour deposition process (CVD). The use of a microwave plasma to deposit CVD films in relation to a plasma impulse chemical vapour deposition process (PICVD) is also known. This process is employed to coat optical elements such as laser mirrors, cold-light mirror reflectors for halogen lamps, etc. Because of their thermal stability and resistance to environmental influences, coatings of this kind have proved successful in chemical applications, such as in the case of diffusion-inhibiting coatings on glass receptacles for the pharmaceutical sector.

A gas discharge takes place in a vacuum vessel in the PICVD process. A vacuum in the range of 1 mbar is a standard operating condition in this case. A microwave frequency of 2.45 GHz is provided for the coating operation. $SiO_2$ and $TiO_2$ coatings are provided to coat mirrors of cold-light lamps, for example. The activation temperature is lower in the PICVD process than in the CVD process, as microwaves are used for initiation.

The CVD process comprises a gas inlet, a vacuum vessel and a heat source. It is carried out either at normal pressure without a pump or at low pressure in the mbar range with a pump and paying attention to pressure stability. The equilibrium processes take place at temperatures of approximately 1,000° C.

In the PICVD process the plasma must burn in the vicinity of the coating point. The receptacle, which is to be coated on the inside, for example, must be transparent or penetrable to the corresponding wavelengths of the microwaves.

Inner surface-finishing of hollow bodies is used, inter alia, in the optical, metallurgical, electrical and semiconductor industries. The object of surface-finishing in these cases is, for example, to protect against wear, reduce friction and adhesion tendencies, protect against corrosion, etc. For example, nozzles, forming tools, semifinished products, tubes or similar are surface-finished in this respect. Hollow bodies of this kind may consist of metal, glass, ceramics or plastics materials.

A disadvantage of the known thermal CVD processes lies in the fact that a high deposition temperature is required for the deposition process, which means that the choice of materials which can be coated is extremely limited. An ion bombardment which is not possible in the thermal CVD processes is required for many film systems, in particular wear-resistant films, in order to achieve the desired morphology.

The PICVD process necessitates the use of microwave excitation. However this is expensive and impossible to utilise with metal, for example, as described above.

Also known is a physical gas phase deposition in the form of the physical vapour deposition (PVD) process, in which finishing takes place by means of evaporation deposition, sputtering or ion plating. The PVD process operates at lower temperatures than the CVD process and is particularly suitable for finishing optical components. Inner surfaces of a hollow body are finished by means of the PVD process with a wire and a laser or, as proposed in JP 63-137167 A, with an ion beam. The tip of the wire is melted by the laser (or the ion beam) and evaporates. This process requires a straight hollow body without bends. However further disadvantages of this process lie in its high costs due to the use of a laser or ion beam and the risk of droplets forming in the edge region. The use of the ion beam is also called ion-beam sputtering.

In JP 63-26373 A a tube, as the hollow body, is coated by means of a hollow-cathode glow discharge, with the hollow body itself being the cathode. The disadvantages here lie in the fact that only tubes of a fairly large diameter and of a completely straight form can be internally coated and that the discharge stops after some time when coating with an insulating film. Moreover, the tube used for the hollow-cathode coating is unintentionally coated at the same time.

DD 294 511 A5 also proposes a hollow-cathode glow discharge for internally coating tubes. A PVD process is used here, the source is inserted in the tube and the hollow space inside the tube simultaneously forms a vacuum chamber. A relative source is required, as otherwise only local coatings are effected, and only relatively large hollow spaces can be coated, these also having to be tubular.

The object of the invention is therefore to provide a process and an apparatus which generally enable the inner surface of the hollow body to be surface-finished trouble-free irrespective of the material which is used and the shape of the hollow body.

The object is solved by a process in which the hollow body is finished from inside by means of a hollow-cathode glow discharge as the excitation source, and a gas stream flowing through the hollow body extracts particles from a plasma forming during the hollow-cathode glow discharge, excites them and transports them to the inner surface of the hollow body, where they initiate the finishing process, wherein the hollow body is disposed in a vacuum vessel, and the hollow body and the hollow cathode form elements which are separate from one another.

The object of the invention is solved by an apparatus by providing a hollow cathode, a gas supply, a vacuum vessel and a plasma. Developments of the invention are defined in the respective subclaims.

A process and an apparatus for surface-finishing inner surfaces of hollow bodies with at least one opening are thereby provided in which the inner surface of the hollow body can generally be surface-finished irrespective of the material which is used and the shape of the hollow body. This surface-finishing can take place at a high rate which corresponds to those which can be achieved on planar substrates with excitation by means of hollow-cathode glow discharge. The rate preferably lies in the range from 1 to 100 $\mu$m/hour; for comparison: in the CVD process only a few $\mu$m/hour are usually achieved, in the PVD process up to 10 $\mu$m/hour. The conventional PVD process is less suitable for finishing hollow spaces, as a decrease in the film growth rate is generally recorded in this case.

The finishing is preferably carried out by means of CVD or PVD or by means of plasma diffusion or plasma or ion etching, whereby either a coating is applied or material is removed. Plasma removal or diffusion serves to clean, etch, nitride, carbonitride or simply activate, with surface films being removed in particulate form or oxidized or reduced or $N_2$ or C being diffused into the surface. The process according to the invention therefore enables a finish to be produced both with just a reactive gas (CVD) and with just metals (PVD).

A gas stream preferably flows through the hollow cathode, with particular preference being given to an inert gas. Argon gas may preferably be used in this case. The inert gas stream then functions as a transport means for the film-forming particles or for the particles reacting at the surface of the hollow body. It therefore serves to control the material flow.

It is particularly preferable either to position the hollow body to be finished from inside on the excitation source of the hollow-cathode glow discharge and the gas supplies such that the gases and particles flow into the hollow body, or to insert the hollow cathode in the hollow body to be finished. The particles flowing into the hollow body are either constituents of the inert gas, a reactive gas or they are sputtered cathode atoms of the hollow cathode.

The hollow bodies which are to be finished have an inside diameter of 1 mm to 100 mm, for example. They may advantageously be of any desired shape, in particular an angular tube or a hollow element of a complex shape.

It is particularly preferable to cool the hollow cathode. Because of the high energy conversion required to achieve a higher film rate, the hollow cathode could be destroyed after a certain time if no additional cooling were provided. In order to prevent this destruction, pulsed operation in the form of a plasma impulse may be provided as an alternative to cooling. In this case the hollow cathode is only operated for a short time. However in some cases only a restricted film thickness can then be achieved.

The choice of film depends on the purpose, with titanium nitride, for example, preferably being used. The process temperature is between 300° C. and 500° C. Amorphous carbons graphitize as soon as temperatures exceed 200° C. On the basis of the coating source, the power input which takes place allows the operation to end in a certain temperature. In order to be able to apply compensating controls here, cooling or heating is preferably provided.

It is particularly preferable for the pressure in the vacuum chamber surrounding the hollow body and the hollow cathode to lie between approximately 0.1 mbar and approximately 100 mbar. Stable burning of the respective type of discharge type can thereby be guaranteed.

Figure 2:
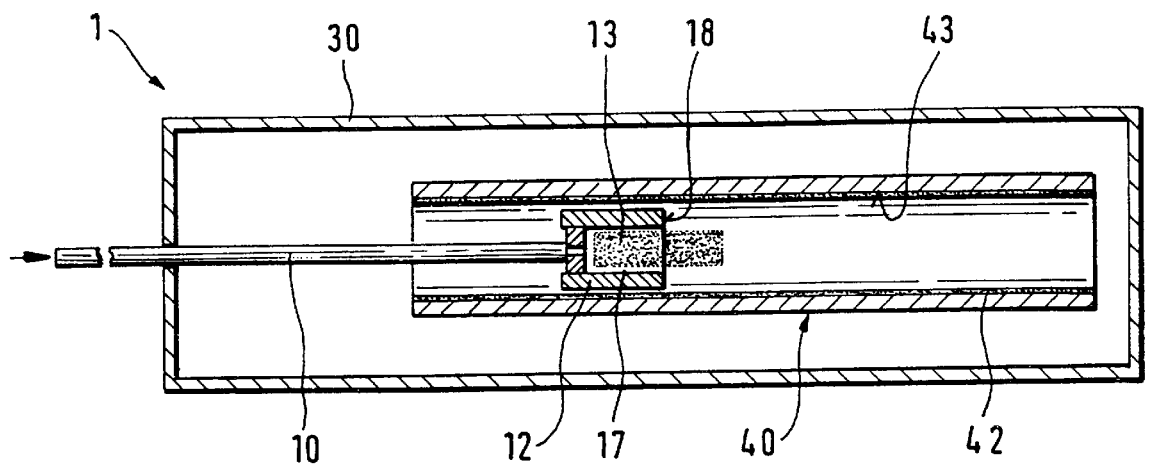
Figure 3:
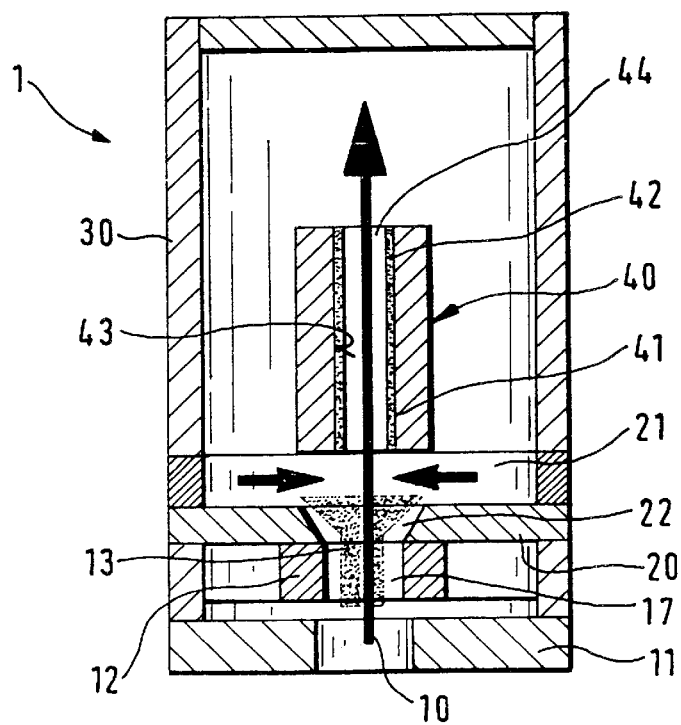

In order to provide a detailed illustration of the invention, embodiments of an apparatus according to the invention for surface-finishing inner surfaces of hollow bodies with at least one opening are described in detail in the following on the basis of the drawings, in which:

FIG. 1 is a sectional view of a first embodiment of an apparatus according to the invention, in which the hollow cathode is disposed outside of the hollow body to be finished, FIG. 2 is a basic outline of a second embodiment of an apparatus according to the invention, in which the hollow cathode is inserted in the hollow body which is to be internally coated, and FIG. 3 is a basic outline of a third embodiment of an apparatus according to the invention, in which the hollow cathode is disposed outside of the hollow body which is to be finished.

FIG. 1 is a basic outline of a sectional view of a first embodiment of an apparatus 1 according to the invention. A gas supply 10 for inert gas is provided in the lower region of the apparatus 1. A housing 11 is disposed above this inert gas supply. The housing 11 comprises aligned openings 16 at its underside and at its top side 14, 15.

A tube target of a hollow cathode 12 is provided in the housing 11.

A vacuum chamber 30 or vacuum vessel with spacer rings 20 provided therein is positioned on the top side 15 of the housing 11. These rings serve to create a spacing with respect to a substrate holder 32, which is provided with its openings 36 above the openings 16. The spacer rings 20 comprise a gas supply 21 for additional gas as reactive gas. This may be formed, for example, as an annular nozzle. The gas flowing in this annular nozzle is therefore uniformly distributed along the circumference of the spacer rings 20.

A screen or shield 31 is firstly provided inside the vacuum chamber 30. A substrate holder 32 is disposed inside this shield 31. This substrate holder bears a substrate or a hollow body 40 without or with the substrate 41. It is therefore possible to finish either a hollow body without a substrate or one with a substrate or, e.g. for test purposes, just a substrate, which can then be removed from the holder and tested separately as to the result of the finishing. Finally, a coating 42 is to be applied to or a finish provided on the inner surface 43 of the hollow body 40.

An inert gas, for example argon gas, is routed through the inert gas supply 10 for this purpose. The inert gas passes from the underside 14 of the housing 11 through the opening 16 into the interior space 17 of the hollow cathode 12. The hollow-cathode glow discharge then produces a plasma 13 in this interior space 17. Because the inert gas is supplied from the underside of the housing, the plasma is moved in the direction of the upper opening 16 in the top side 15 of the housing 11.

The plasma 13 is joined by an additional gas through the gas supply 21 in the region of the spacer rings 20. The spacer rings are provided to prevent the additional gas from diffusing into the hollow cathode. Gases and plasma flow into the hollow body 40 and form the coating 42 on its inner surface 43.

The mixture of plasma and additional gas as reactive gas passes out of the hollow body again through the upper opening 44 at the top side of the hollow body and the opening 36 in the shield 31.

The surface 43 of the hollow body 40 is therefore only coated by plasma particles and the additional gas by means of this apparatus. In this case constituents of the mixture of additional gas and plasma are deposited as a film or film constituent on the inner surface 43 of the hollow body 40.

In order to prevent the hollow cathode 12 from overheating, this is provided with a cooling system, preferably in the region of the tube target, although this is not shown in FIG. 1.

However the hollow body 40 may also be heated or cooled while its inner surface 43 is being surface-finished. The purpose of the coating on the substrate should be considered and taken as a criterion in this respect, and a desired coating result may be achieved on the basis of a certain temperature, for example.

The vacuum chamber 30 is set to a pressure of approximately 0.1 mbar to approximately 100 mbar, for example, as this pressure results in stable burning of the charge and enables very good coating results to be obtained.

The hollow-cathode glow discharge inside the hollow cathode can be powered by d.c. voltage or by pulsed a.c. voltage with a frequency of approximately 1 kHz to 10 GHz with a provided voltage of approximately 200 V to 2000 V. However, as an alternative or in addition to this, the inner surface 43 of the hollow body may be placed at a negative electric potential with respect to the plasma 13 inside the hollow cathode 12. In this case, for example, values of several tens of volts V to several hundreds of volts V are possible. Because of the potential difference, positively charged particles from the plasma 13 of the hollow cathode 12 or from a non-self-maintained charge, supported by the plasma of the hollow cathode, are accelerated in the hollow space of the hollow body towards its inner surface and the surface coating is thus reinforced.

FIG. 2 shows a second embodiment of an apparatus according to the invention as a basic outline. In this variant the hollow cathode 12 is provided with the gas supply 10 for inert gas. This is preferably formed as a rigid pipeline. The hollow cathode can thereby be inserted in the hollow body 40. In the case of, for example, a very long hollow body, for example a tube, the hollow cathode can thereby finish the entire length of the tube on the inside.

A hollow-cathode glow discharge is produced inside the hollow cathode 12 and the plasma 13 thus formed by an inert gas supply, for example. This now attempts to leave the interior space 17 at the top side 18 of the hollow cathode 12 and enter the hollow body 40. The plasma is transported by the gas stream in a greater region towards the inner surface of the hollow body, where it effects the coating or finish. Here it can either diffuse into the surface or remove material from the surface. Plasma diffusion or the plasma or ion etching process is preferably used for this kind of material removal.

In the embodiment according to FIG. 2 the surface is therefore finished by means of plasma particles and, in particular, cathode material of the hollow cathode removed in particulate form. This operation is called cathode sputtering or sputtering.

In order to achieve results which are as appropriate as possible, the hollow bodies 40 preferably have an inside diameter of 1 mm to 100 mm. Other known finishing or coating processes may also be used for larger inside diameters.

When the inside diameter is less than 1 mm, the manufacturing expenditure for a hollow cathode of correspondingly small dimensions which can still be inserted in the hollow body is so high that the costs in question are not justified for the use.

FIG. 3 shows a third embodiment of an apparatus 1 according to he invention as a basic outline. The structure resembles that of the first embodiment according to FIG. 1. It is just the shape of the inner opening of the spacer ring which is different, i.e. funnel-shaped. The plasma 13 formed in the interior space 17 of the hollow cathode 12 is therefore distributed over a greater area. The additional gas 21 inflowing higher up can then mix better with the plasma on the one hand and cannot flow into the hollow cathode so easily on the other. This is due to the inert gas flowing out in a large angular range.

A different gas which is suitable for a hollow-cathode glow discharge may also be used as an alternative to an inert gas supply. The choice of the additional gas as reactive gas depends on the result which is to be achieved on the substrate and hence on the desired coating on or the finish of the inner surface of the hollow body.

List of Reference Numbers 1 apparatus
10 inert gas supply
11 housing
12 tube target of the hollow cathode
13 plasma
14 underside
15 top side
16 openings
17 interior space
18 top side
20 spacer rings
21 gas supply for additional gas
22 inner opening
30 vacuum chamber
31 shield
32 substrate holder
36 opening
40 hollow body
41 substrate
42 finish/coating
43 inner surface
44 upper opening

What is claimed is:

1. Process for surface-finishing inner surfaces of hollow bodies with at least one opening, in which the hollow body is finished from the inside by means of hollow cathode glow discharge as an exciting source, the hollow cathode being inserted in the hollow body to be finished at its inner surface, and a gas stream flowing through the hollow body extracts particles from a plasma forming during the hollow-cathode glow discharge, excites them and transports them to the inner surface of the hollow body, where they initiate the finishing process, wherein the hollow body is disposed in a vacuum vessel, and the hollow body and the hollow cathode form elements which are separate from one another.

2. Process according to claim 1, characterised in that cathode sputtering takes place, with particles being removed from the cathode surface of the hollow cathode, and that the particles are transported by the gas stream flowing through the hollow body to the inner surface of this body, where they are deposited.

3. Process according to claim 1, characterised in that an additional gas reaches the inner surface of the hollow body by diffusion or as a flow, that constituents from the additional gas are deposited as a film or film constituent on the inner surface of the hollow body and diffuse into the inner surface or remove material from the inner surface, in so doing helping to finish the inner surface.

4. Process according to claim 1, characterised in that the surface-finishing is effected by plasma particles and cathode material which is sputtered.

5. Process according to claim 1, wherein the surface-finishing takes place by means selected from the group consisting of physical vapour deposition, chemical vapour deposition, plasma diffusion, plasma etching, and ion etching.

6. Apparatus for carrying out a process for surface-finishing inner surfaces of hollow bodies with at least one opening comprising:
   a hollow cathode disposed inside the hollow body;
   a gas supply;
   a vacuum vessel for holding the hollow cathode and at least a part of a hollow body to be coated;
   an anode;
   a current supply; and
   a plasma.

7. Apparatus according to claim 1, characterised in that the hollow body to be finished has an inside diameter of 1 to 100 mm.

* * * * *